United States Patent
Smith

(10) Patent No.: US 6,246,296 B1
(45) Date of Patent: Jun. 12, 2001

(54) PULSE WIDTH MODULATOR (PWM) WITH HIGH DUTY CYCLE USING BOOTSTRAP CAPACITOR

(75) Inventor: Robert C. Smith, Blacksburg, VA (US)

(73) Assignee: Kollmorgen Corporation, Waltham, MA (US)

(*) Notice: Subject to any disclaimer, the term of this patent is extended or adjusted under 35 U.S.C. 154(b) by 0 days.

(21) Appl. No.: 09/110,603

(22) Filed: Jul. 6, 1998

(51) Int. Cl.[7] ...................................................... H03K 7/08
(52) U.S. Cl. .......................... 332/109; 332/110; 327/291; 327/589; 326/88; 326/92
(58) Field of Search ................................. 330/10; 326/92; 327/291, 175; 332/109, 110

(56) References Cited

U.S. PATENT DOCUMENTS 4,633,106 * 12/1986 Backes et al. .
4,992,749 * 2/1991 Tokumo et al. ........................ 330/10

* cited by examiner

*Primary Examiner*—Arnold Kinkead
(74) *Attorney, Agent, or Firm*—Morgan & Finnegan, LLP

(57) ABSTRACT

A pulse width modulation (PWM) amplifier of the type including power transistors connected in totem-pole fashion and a bootstrap capacitor used to bias at least one of the power transistors into the conductive state. The improvement wherein the bootstrap capacitor is refreshed only to the extent needed to provide a higher effective maximum duty cycle.

14 Claims, 2 Drawing Sheets

PULSE WIDTH MODULATOR (PWM) WITH HIGH DUTY CYCLE USING BOOTSTRAP CAPACITOR

FIELD OF THE INVENTION

The invention relates to an improved pulse width modulated (PWM) power stage gate drive using a bootstrap capacitor such as can be used in motor controllers.

BACKGROUND OF THE INVENTION

In PWM amplifier power stages utilizing IGBT (insulated gate bipolar transistor) or FET (field effect transistor) power switching devices, the switching transistors are usually connected in pairs in totem pole fashion between the rails of the power source. The output load terminal can be connected to the upper rail through the upper switching transistor or can be connected to the lower rail through the lower switching transistor. The power supplied to the load is controlled according to the pulse width determined by the ON time during each operating cycle. Most motor controllers are of a three phase design and therefore include three pairs of power switching transistors.

Such power stages generally require a floating power supply to bias the upper switching devices into the conductive or ON state. A "bootstrap" capacitor can be employed for this purpose. The bootstrap capacitor is charged while the lower switching transistor is conductive and connects the capacitor to the lower rail. When the lower transistor is OFF and the upper switching transistor is being rendered conductive, the capacitor is level shifted to the upper rail and drives the upper switching transistor into the fully conductive state. With this arrangement a portion of each operating cycle must be reserved for recharging the capacitor and, therefor, the lower switching device must be ON for a minimum portion of each operating cycle regardless of the instantaneous power needs. As a result the duty cycle is limited to about 85% and only about 70% of the available power can be supplied to the load.

SUMMARY OF THE INVENTION

An object of the invention is to provide an improved PWM type amplifier with a higher duty cycle than could be supplied by prior conventional designs.

Another object of the invention is to provide an improved PWM amplifier of smaller size and reduced complexity.

With the PWM amplifier according to the invention the amount of time allotted for charging the bootstrap capacitor is substantially reduced and therefore permits a higher maximum duty cycle than could be achieved with conventional designs. The bootstrap capacitor is refreshed only when needed as a function of time or existing storage level. For example, if the operating cycle is at the 50 kHz rate, the refresh rate could be set at 1 kHz with a short refresh time on the order of 3 microseconds. With this arrangement the effective maximum duty cycle would be increased to about 99.7%. Alternatively, the system could measure the charge state of the bootstrap capacitor and refresh the capacitor only when the charge state falls below a predetermined level.

BRIEF DESCRIPTION OF THE DRAWINGS

The forgoing and other objects are achieved according to the illustrative embodiments in the following specification which includes the drawings wherein.

DETAILED DESCRIPTION OF THE INVENTION

Figure 1:
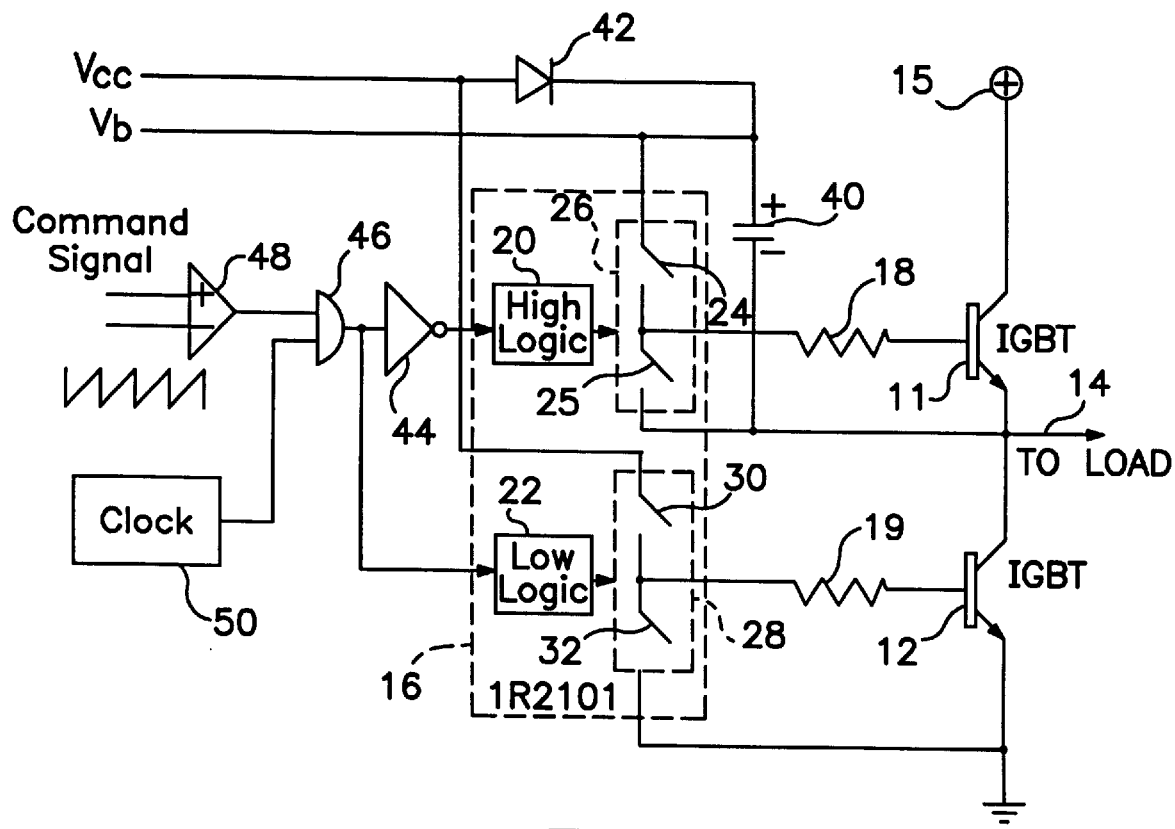
FIG. 1 is a schematic diagram according to one embodiment wherein the refresh or the bootstrap capacitor is clock controlled.

In the embodiment illustrated in FIG. 1, the power output stage includes a pair of IGBT (insulated gate bipolar transistor) power transistors 11 and 12 connected in totem pole fashion to the upper rail of power source 15. Specifically, the collector of transistor 11 is connected to the upper rail of power source 15, the emitter of transistor 12 is connected to the lower rail ground, and the common junction of the emitter of transistor 11 and the collector of transistor 12 is connected to the load 14. When transistor 11 is conductive and transistor 12 is non-conductive, the load is connected to source 15. When transistor 12 is conductive and transistor 11 is non-conductive, the load is connected to ground. FETs (field effect transistors) can be used in place of the IGBTs as the power switching devices.

A high speed power driver 16, such as IR2101 from International Rectifier, can be used as the driver for power transistors 11 and 12. The power driver includes an upper pair of transistor switches 24 and 25 having a common junction connected to the base of power transistor 11 via resistor 18, and a lower pair of transistor switches 30 and 32 having a common junction connected to the base of power transistor 12 via a resistor 19. A high logic circuit 20 controls the state of switching transistors 24 and 25 of switch pair 26 and a low logic circuit 22 controls the state of switching transistors 30 and 32 of switch pair 28. Switch pair 26 is supplied from a floating power source $V_b$. Switch pair 28 is supplied from power source $V_{cc}$.

A fixed voltage supply Vcc is connected to the positive plate of a bootstrap capacitor 40 via a diode 42. The other plate of capacitor 40 is connected to the common load connection of transistors 11 and 12. The bootstrap capacitor is charged from the source $V_{cc}$ via diode 42 when power transistor 12 is conductive. The charge on the bootstrap capacitor is level shifted to the upper rail to provide a floating supply to the upper power transistor. The discharge of the capacitor through the base-emitter circuit of the upper transistor 11 drives the transistor into the fully conductive state.

Pulse width modulation for the FIG. 1 embodiment is developed in a comparator 48 which compares the incoming command signal level to a sawtooth wave. The comparator produces an increasingly wider pulse as the command signal level increases. The PWM pulse train from comparator 48 passes through an AND gate 46 and an inverter 44. The output of AND gate 46 is supplied to low logic circuit 22 and the inverted version thereof is supplied to high logic 20. A clock 50 periodically produces a pulse passing through AND gate 46 to render lower power transistor 12 conductive to thereby assure a periodic refresh charge for capacitor 40.

Figure 2A:
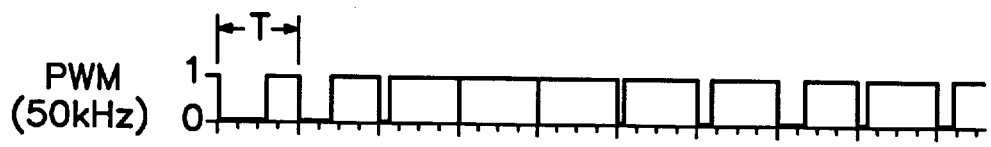
FIGS. 2A and 2B are pulse timing diagrams for the embodiment in FIG. 1.
Figure 2B:
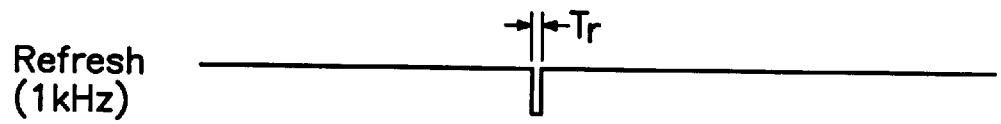

FIGS. 2A and 2B illustrate the relationship of the PWM pulses and the refresh pulses. For the PWM pulses the cycle of operation period T is divided so the pulse width (portion of the operating cycle time T) corresponds to the desired level. At the maximum current level the PWM pulse may be continuous over several periods. A refresh pulse $T_r$ is periodically supplied to assure a refresh pulse when operating at high duty cycles. When operating at low duty cycles, the capacitor is refreshed each cycle while the lower switching transistor is conductive. At high duty cycles the needs for refreshing the charge are modest but cannot be ignored. For example, if the operating cycle is 50 kHz, a refresh rate of 1 kHz as shown in FIG. 2B has been found adequate. With this arrangement the maximum duty cycle can be increased from about 85% to above 99%. The size of the capacitor is selected such that the capacitor holds its charge within the allocated refresh rate of, for example, 1 kHz.

Figure 3:
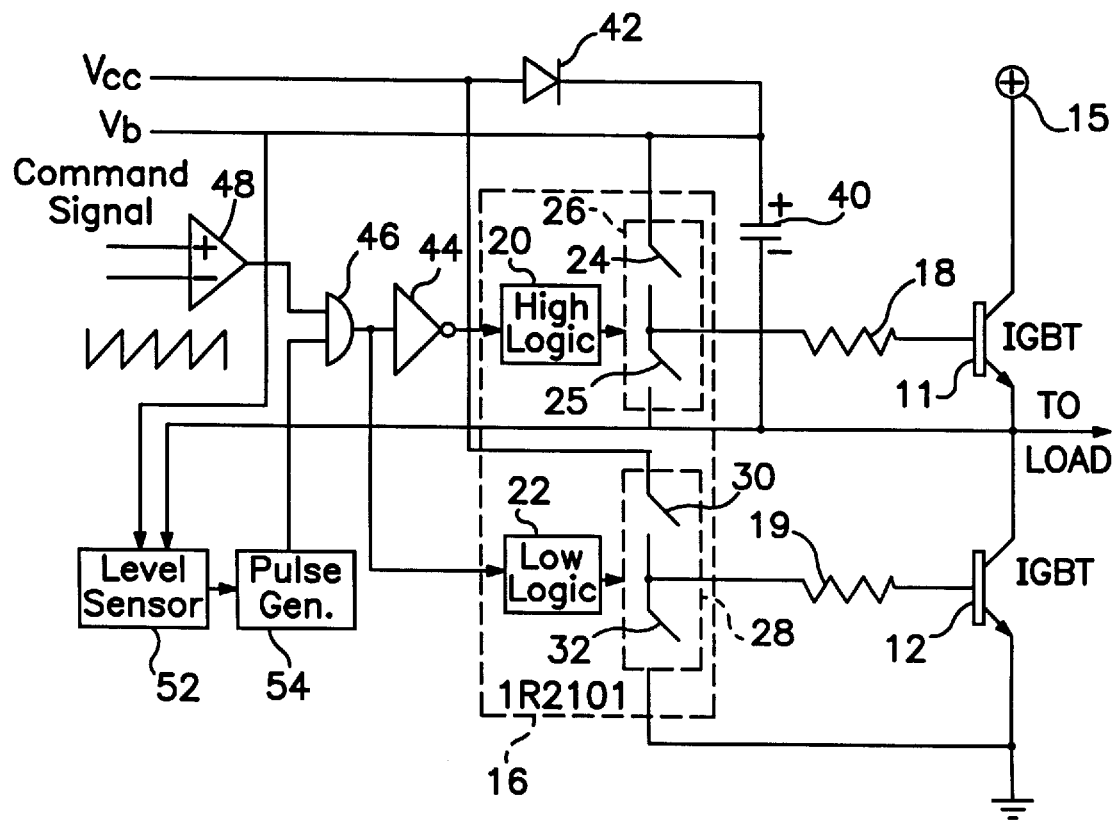
FIG. 3 is a schematic diagram according to another embodiment wherein the refresh for the bootstrap capacitor is controlled by a charge level sensor.
Figure 4A:
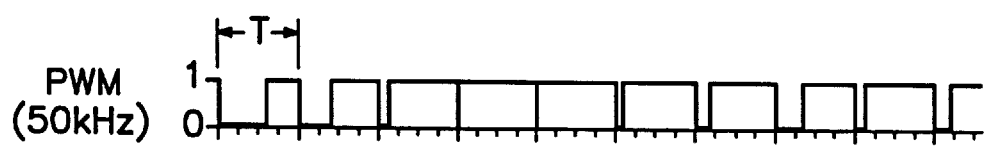
FIGS. 4A and 4B are pulse timing diagrams for the embodiment in FIG. 3.
Figure 4B:

An alternative embodiment is illustrated in FIG. 3 wherein the bootstrap capacitor receives a refresh charge only when needed. Components 11–48 in FIG. 3 are the same as corresponding components in FIG. 1 and operate in substantially the same way.

A level sensor circuit 52 is connected across bootstrap capacitor 40 and measures the state of charge for the capacitor. Level sensor 52 is coupled to one of the inputs of AND gate 46 via a pulse generator 54. When the state of charge falls below a predetermined level, pulse generator 54 produces a refresh pulse $T_r$ which passes through AND gate 46 and turns ON the lower switching transistor 12 for an interval sufficient to supply a refresh charge.

Although only a few embodiments have been illustrated in detail, it should be obvious that other embodiments may be included within the scope of this invention. In particular, field effect transistors can be used in place of the IGBT transistors 11 and 12. Also, the switching transistors can be in a six transistor, three phase configuration or in a four transistor, two phase configuration. The scope of the invention is defined in the appended claims.

What is claimed is:

1. A pulse width modulator (PWM) with improved duty cycle during a cycle of operation, comprising:

three pairs of power switching devices connected between upper and lower rails of a power source and providing a three-phase output, the upper of each paid of said power switching devices being connected to said upper rail and the lower of each pair of said power switching devices being connected to said lower rail;

a bootstrap capacitor, for each of said three pairs of power switching devices, so connected that said capacitor is charged when said lower switching device of a corresponding pair of power switching devices of said three pairs of power switching devices is conductive, and said capacitor is discharged to maintain said upper switching device of said corresponding pair of power switching devices in the conductive state when said lower switching device of said corresponding pair of power switching devices is in the nonconductive state; and means for controlling the charging of said capacitors so that charging takes place only on selected cycles of the operation when needed as a function of time.

2. A pulse width modulator (PWM) with improved duty cycle during a cycle of operation, comprising:

at least one pair of power switching devices connected between upper and lower rails of a power source, the upper of the pair of said switching devices being connected to said upper rail and the lower of the pair of said power switching devices being connected to said lower rail;

a bootstrap capacitor so connected that said capacitor is charged when said lower switching device is conductive, and said capacitor is discharged to maintain said upper switching device in the conductive state when said lower switching device is in the nonconductive state; and means for controlling the charging of said capacitor so that charging takes place only on selected cycles of the operation when needed as a function of time, wherein said means for controlling the charging of said capacitor includes a clock operating at a repetition rate lower than said cycle of operation.

3. A pulse width modulator (PWM) with improved duty cycle during a cycle of operation, comprising:

at least one pair of power switching devices connected between upper and lower rails of a power source, the upper of the pair of said switching devices being connected to said upper rail and the lower of the pair said of power switching devices being connected to said lower rail;

a bootstrap capacitor so connected that said capacitor is charged when said lower switching device is conductive, and said capacitor is discharged to maintain said upper switching device in the conductive state when said lower switching device is in the nonconductive state; and means for controlling the charging of said capacitor so that charging takes place only on selected cycles of the operation when needed as a function of time, wherein said means for controlling the charging of said capacitor includes a sensor for detecting when the charge on said capacitor falls below a predetermined level to cause charging of said capacitor.

4. A pulse width modulator (PWM) according to claim 1 wherein said power switching devices are IGBT transistors.

5. A pulse width modulator (PWM) according to claim 1 wherein said power switching devices are FET transistors.

6. A pulse width modulator (PWM) with improved duty cycle during a cycle of operation, comprising:

three pairs of power switching transistors connected between upper and lower rails of a power source and providing a three-phase output, the upper of each pair of said power switching transistors being connected to said upper rail and the lower of each pair of said power switching transistors being connected to said lower rail;

a bootstrap capacitor, for each of said three pairs of power switching transistors, so connected that said capacitor is charged when said lower switching transistor of a corresponding pair of power switching transistors of said three pairs of power switching transistors is conductive, and said capacitor is discharged to drive said upper switching transistor of said corresponding pair of power switching transistors into the conductive state when said lower switching transistor of said corresponding pair of power switching transistors is in the nonconductive state; and at least one clock for periodically rendering said lower switching transistors of said three pairs of power switching transistors conductive after a predetermined number of operating cycles.

7. A pulse width modulator (PWM) according to claim 6 wherein said power switching transistors are insulated gate bipolar transistors (IGBTs).

8. A pulse width modulator (PWM) according to claim 6 wherein said power switching transistors are field effect transistors (FETs).

9. A pulse width modulator (PWM) with improved duty cycle during a cycle of operation, comprising:
- at least one pair of power switching devices connected between upper and lower rails of a power source, the upper of the pair of said switching devices being connected to said upper rail and the lower of the pair of said power switching devices being connected to said lower rail;
- a bootstrap capacitor so connected that
  - said capacitor is charged when said lower switching device is conductive, and
  - said capacitor is discharged to maintain said upper switching device in the conductive state when said lower switching device is in the nonconductive state; and
- means for controlling the charging of said capacitor so that charging takes place only on selected cycles of the operation when needed as a function of existing storage level.

10. A pulse width modulator (PWM) according to claim 9 including three pairs of power switching devices to provide a three phase output.

11. A pulse width modulator (PWM) according to claim 9 wherein said means for controlling the charging of said capacitor includes a clock operating at a repetition rate lower than said cycle of operation.

12. A pulse width modulator (PWM) according to claim 9 wherein said means for controlling the charging of said capacitor includes a sensor for detecting when the charge on said capacitor falls below a predetermined level to cause charging of said capacitor.

13. A pulse width modulator (PWM) according to claim 9 wherein said power switching devices are IGBT transistors.

14. A pulse width modulator (PWM) according to claim 9 wherein said power switching devices are FET transistors.

* * * * *